(12) United States Patent
Mangu et al.

(10) Patent No.: US 12,424,483 B2
(45) Date of Patent: Sep. 23, 2025

(54) 3D NAND WITH INTER-WORDLINE AIRGAP

(71) Applicant: INTEL NDTM US LLC, Santa Clara, CA (US)

(72) Inventors: Vijay Saradhi Mangu, Albuquerque, NM (US); David Meyaard, Boise, ID (US); Randy Koval, Albuquerque, NM (US); Krishna Parat, Palo Alto, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 950 days.

(21) Appl. No.: 17/351,803

(22) Filed: Jun. 18, 2021

(65) Prior Publication Data
US 2022/0406646 A1    Dec. 22, 2022

(51) Int. Cl.
| | | |
|---|---|---|
| H01L 21/768 | (2006.01) | |
| H01L 21/311 | (2006.01) | |
| H01L 23/522 | (2006.01) | |
| H01L 23/532 | (2006.01) | |
| H10B 41/27 | (2023.01) | |
| H10B 41/41 | (2023.01) | |
| H10B 43/27 | (2023.01) | |
| H10B 43/40 | (2023.01) | |

(52) U.S. Cl.
CPC .... *H01L 21/7682* (2013.01); *H01L 21/31111* (2013.01); *H01L 21/31144* (2013.01); *H01L 21/76877* (2013.01); *H01L 23/5226* (2013.01); *H01L 23/5329* (2013.01); *H10B 41/27* (2023.02); *H10B 41/41* (2023.02); *H10B 43/27* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 10,622,450 B2 | 4/2020 | Koval et al. | |
| 2019/0043960 A1* | 2/2019 | Koval | H01L 29/40114 |
| 2019/0198510 A1* | 6/2019 | Kim | H10B 41/27 |

* cited by examiner

*Primary Examiner* — Eva Y Montalvo
*Assistant Examiner* — Jiyoung Oh
(74) *Attorney, Agent, or Firm* — Morgan, Lewis & Bockius LLP

(57) ABSTRACT

An embodiment of a memory device may comprise a vertical channel, a first memory cell formed on the vertical channel, a first wordline coupled to the first memory cell, a second memory cell formed on the vertical channel immediately above the first memory cell, a second wordline coupled to the second memory cell, and an airgap disposed between the first wordline and the second wordline. Other embodiments are disclosed and claimed.

14 Claims, 15 Drawing Sheets

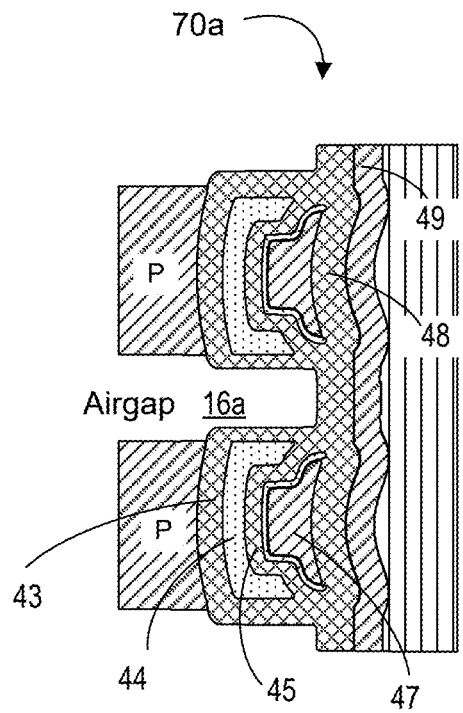
FIG. 13A
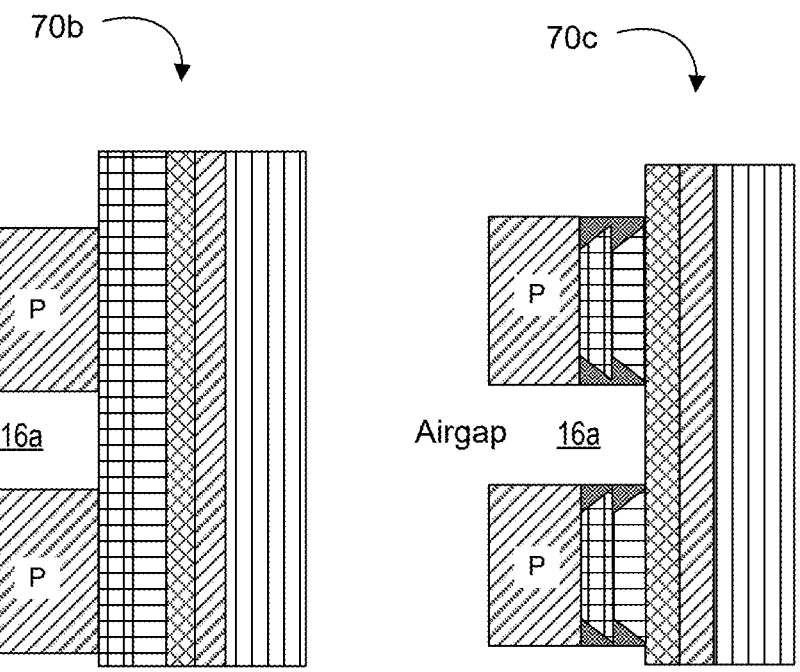
FIG. 13B
FIG. 13C

3D NAND WITH INTER-WORDLINE AIRGAP

BACKGROUND

A typical flash memory device may include a memory array that includes a large number of non-volatile memory cells arranged in row and column fashion. In recent years, vertical memory, such as three-dimensional (3D) memory, has been developed in various forms, such as NAND, cross-point, or the like. A 3D flash memory array may include a plurality of memory cells stacked over one another to form a vertical NAND string. In a floating gate flash cell, a conductive floating gate may be positioned between a control gate and a channel of a transistor. The individual memory cells of the vertical NAND string may be on different layers arranged around a body that extends outward from a substrate, with the conductive floating gate (charge storage region) located on a similar or same plane as the control gate, extending outward horizontally from the body. The plurality of the NAND strings in a die is referred to as memory array for the rest of this material.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 13A to 13C are side cross sectional views of 3D FG NAND cells, charge trap flash (CTF) NAND cells, and isolated CTF NAND cells, respectively, according to embodiments;

DETAILED DESCRIPTION

Figure 1:
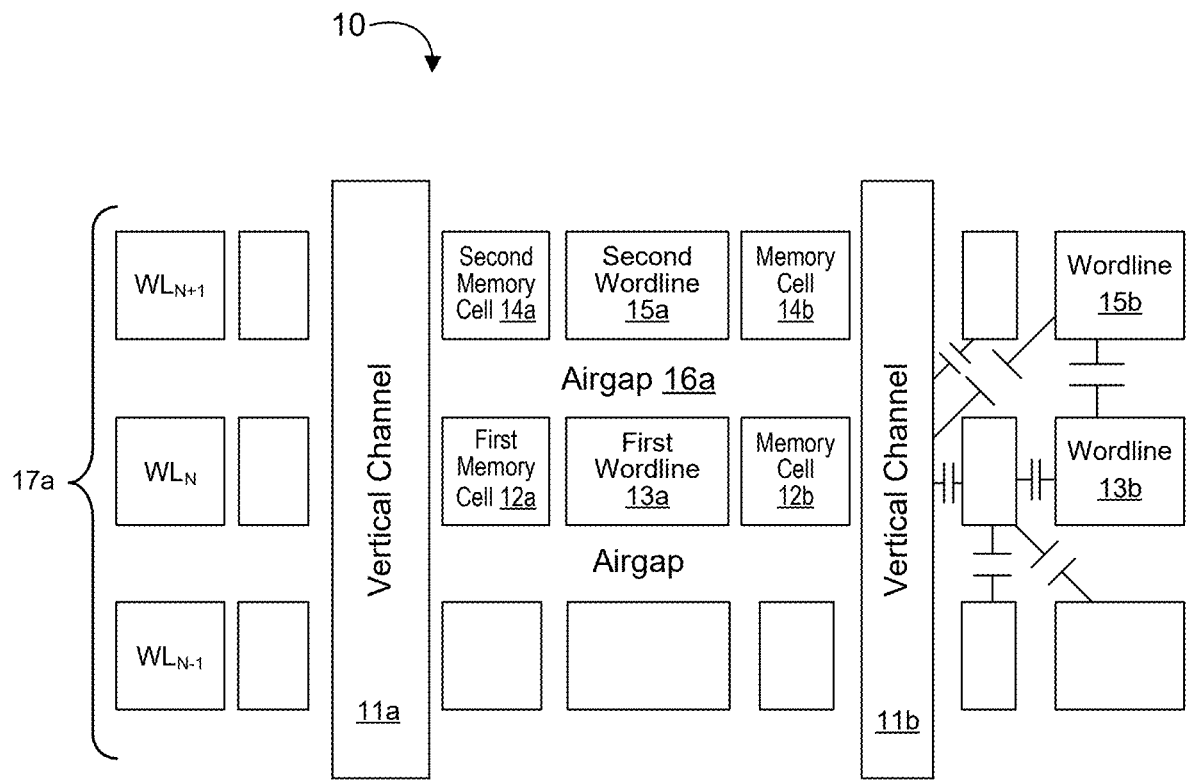
FIG. 1 is a block diagram of an example of a memory device according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; NV memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

NV memory (NVM) may be a storage medium that does not require power to maintain the state of data stored by the medium. In one embodiment, the memory device may include a three-dimensional (3D) NAND device. The memory device may refer to the die itself and/or to a packaged memory product. In particular embodiments, a memory component with non-volatile memory may comply with one or more standards promulgated by the JEDEC, or other suitable standard (the JEDEC standards cited herein are available at jedec.org).

Some embodiments may advantageously provide technology for 3D NAND inter-wordline airgaps. The speeds of read/write/erase of a NAND memory array are some of the factors that determine the performance of a NAND solid-state flash drive product. One of the key enablers for improving the program speed of NAND memory is to reduce the RC (Resistance X Capacitance) time delay for programming signal to reach from periphery to the memory cells and vice versa for read. A conventional 3D NAND memory array comprises silicon dioxide (dielectric constant=3.9) between the conductive wordlines (WLs) of the layer stack. Utilizing alternative materials to reduce the dielectric constant any further will improve the RC delay but comes with a penalty of WL-WL leakage/cross talk which will degrade the reliability of NAND cells during program/erase cycles. Some embodiments provide technology to reduce the RC delay via formation of airgaps between the WLs, which enables ~4× reduction in RC delay and boosts the performance of NAND flash products. Some embodiments achieve the inter-wordline airgap without compromising a floating gate memory cell.

Some embodiments provide manufacturing technology to advantageously reduce a wordline-to-wordline (WL-WL) capacitance by approximately a factor of about 4 (~4×), resulting in improved array performance attributable to reduced wordline resistance and capacitance (RC) delay and/or wordline driver area scaling due to the reduced capacitive load of the array wordlines. Some embodiments additionally improve inter-wordline space scalability by reducing cell-to-cell interference and increasing adjacent WL-WL breakdown voltage (BV)), which results in an advantageous reduction in the total 3D NAND wordline stack height. Some embodiments provide manufacturing technology that preserves quad-level cell (QLC) capability of the floating gate (FG) memory transistor, provides additional margin towards penta-level-cell (PLC) capability after inter-WL airgap formation.

In some embodiments, an integration technique includes disposing of a sacrificial inter-wordline dielectric material (e.g., which typically otherwise comprises silicon oxide in a conventional FG NAND cell) having a dielectric constant of about 3.9, leaving airgap voids having a dielectric constant of about one (1.0) between the wordlines for an about 3.9x× reduction in capacitance. Embodiments are also extendible to charge trap flash (CTF) memory transistors, using the techniques described herein. Advantageously, the reduction in capacitance translates to improved array performance (e.g., reduced RC delay), improved wordline driver device scaling (e.g., reduced capacitive load), and/or improved vertical scalability of the wordline stack to features below 20 nm thickness (e.g., reduced cost).

With reference to FIG. 1, an embodiment of a 3D NAND device stack 10 may include a vertical channel 11a, a first memory cell 12a formed on the vertical channel 11a, a first wordline 13a coupled to the first memory cell 12a, a second memory cell 14a formed on the vertical channel 11a immediately above the first memory cell 12a, a second wordline 15a coupled to the second memory cell 14a, and an airgap 16a disposed between the first wordline 13a and the second wordline 15a. For example, the memory device 10 may further include a vertical 3D NAND string 17a of memory cells formed along the vertical channel 11a, with respective wordlines coupled to each memory cell of the 3D NAND string and respective airgaps disposed between each of the respective wordlines. FIG. 1 shows another vertical channel 11b, with another set of memory cells 12b and 14b with respective wordlines 13b and 15b connected thereto. In some embodiments, examples of which are described in further detail below, the memory device 10 may include an array of vertical 3D NAND strings of memory cells and additional circuitry outside the array, where the respective airgaps are formed only in the area of the array. The memory device 10 may include a plurality of access points to the respective airgaps in the area of the array (examples of which are described in further detail below).

In some embodiments, the NAND cells shown in FIG. 1., i.e., 12a, 12b, 14a, 14b etc.) may comprise floating gate as a type of storage node, and a multi-layer stack for the vertical 3D NAND string 17a of memory cells comprise alternating layers of silicon nitride and polysilicon (e.g., a NPNP stack). The 3D NAND string 17a includes respective control gates/wordlines which control/modulate the charge trapping/detrapping in floating gates of these NAND memory cells, respective layers of inter-wordline dielectric, stacked vertically. For example, in an NPNP stack, the polysilicon are the wordlines/control gates and the silicon nitride is the inter-wordline dielectric which is sacrificial. This dielectric film is exhumed leaving behind an airgap between the wordlines. During this process, the floating gate cells are shielded by thermally grown silicon dioxide, an etch stop layer (ESL) formed during the cell processing.

Figure 5A:
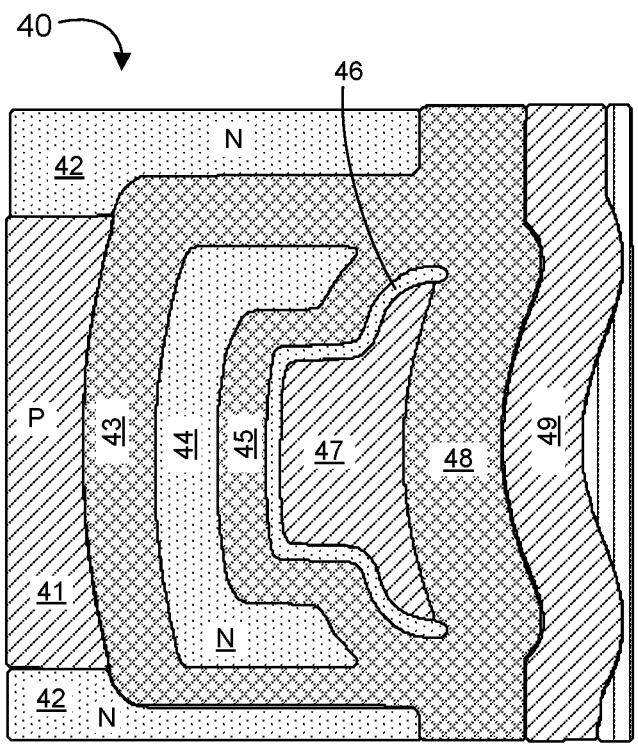
FIGS. 5A and 5B are side cross sectional views of an example of a FG NAND memory cell according to an embodiment.
Figure 5B:
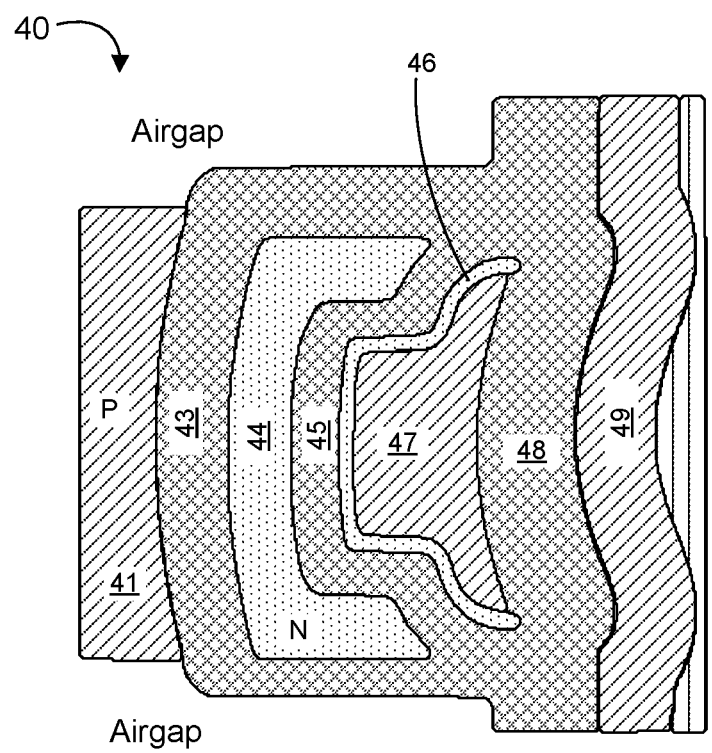

Alternatively, in some embodiments, the NAND memory cells may comprise charge-trap film (CTF) as the storage node which is shared/common to all the wordlines within a string (e.g., see FIG. 13B, described in further detail below) unlike a floating gate (FG) type of cell (e.g., see FIG. 5B).

Advantageously, for both types of architectures, FG and CTF, the NAND stack may be engineered to provide an inter-WL airgap for improved performance and scaling. Specifically, the inter-wordline airgap provides: 1) an about 4× reduction in WL RC which provides improved performance or improved scaling of the devices that comprise the peripheral circuitry that's used to apply operating voltages to the NAND array; 2) a reduced cell-to-cell interference for improved reliability 3) improved composite layer stack/scaling of the wordline pitches; and/or 4) significant reduction in the mechanical stress of the composite stack and reduction in the total wafer warpage during and after manufacturing steps.

The material described herein focuses on an example technique for formation of airgaps in both types of architectures (FG and CTF) of 3D NAND devices.

Figure 2:
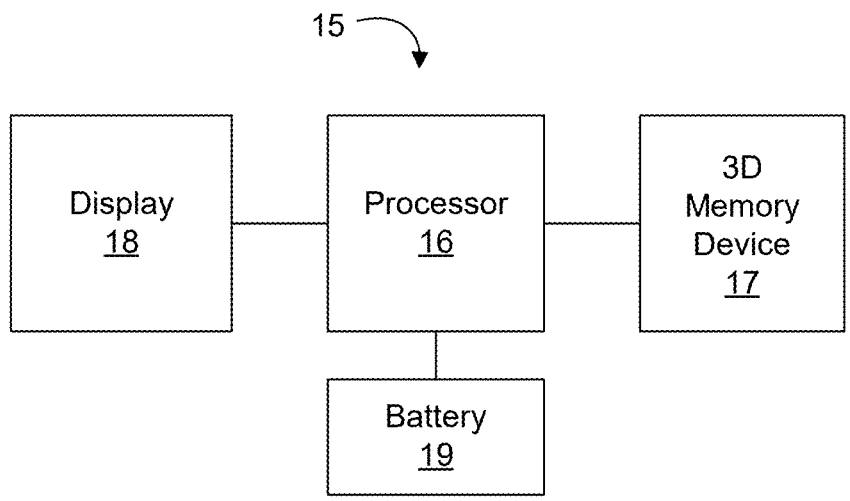
FIG. 2 is a block diagram of an example of a system according to an embodiment.
Figure 3:
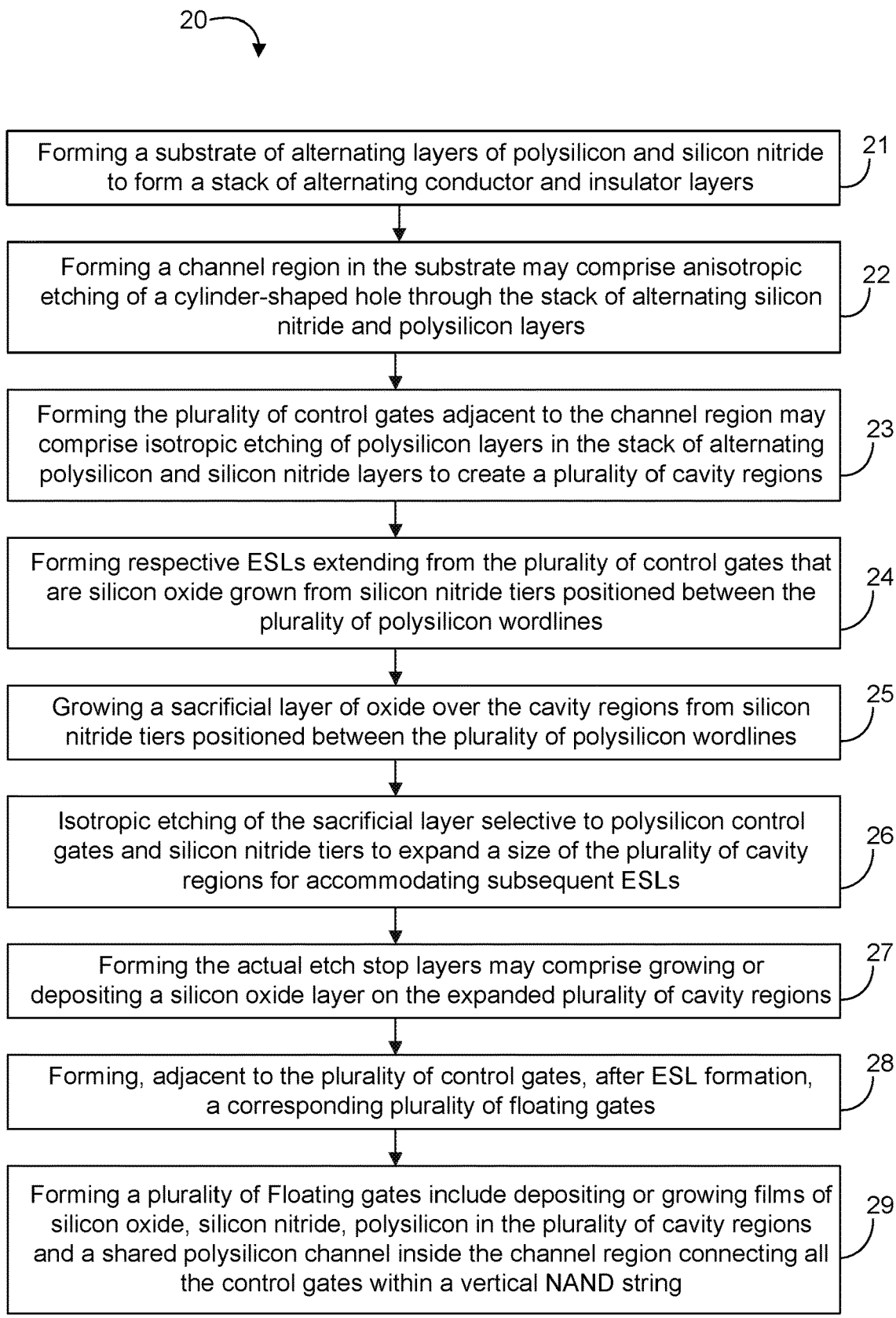
FIG. 3 is a flowchart of an example of a method according to an embodiment.

With reference to FIG. 2, an embodiment of a system 15 may include a processor 16, and a 3D memory device 17 coupled with the processor 16, where the 3D memory device 17 is configured similar to the memory device 10. In particular, in the system 15, the 3D memory device 17 may include a vertical channel, a first memory cell formed on the vertical channel, a first wordline coupled to the first memory cell, a second memory cell formed on the vertical channel immediately above the first memory cell, a second wordline coupled to the second memory cell, and an airgap disposed between the first wordline and the second wordline. For example, the 3D memory device 17 may further include a vertical 3D NAND string of memory cells formed along the vertical channel 11a, with respective wordlines coupled to each memory cell of the 3D NAND string and respective airgaps disposed between each of the respective wordlines.

In some embodiments of the system 15, the 3D memory device 17 may include an array of vertical 3D NAND strings of memory cells and additional circuitry outside the array, where the respective airgaps are formed only in the area of the array. The 3D memory device 17 may include a plurality of access points to the respective airgaps in the area of the array. In some embodiments, the system 15 may comprise a mobile computing device and may include any of a number of connected devices, peripherals, and/or components, such as at least one of a display 18 communicatively coupled to the processor 16, or a battery 19 coupled to the processor 16, etc.

With reference to FIGS. 3, 4A to 4H, and 5A to 5B, an embodiment of a method 20 to manufacture 3D NAND floating gate devices (FIG. 3) may correspond to an integration process 30 (see FIGS. 4A to 4F), with a representative result of a FG NAND cell 40 (see, FIG. 5B). These devices are designed to enable inter-WL airgap formation, as described in more detail in connection with FIGS. 6 to 10.

3D NAND FG memory devices construction may include forming a substrate of alternating layers of polysilicon conductor and silicon nitride insulator layers at block 21, which will be referred to as a layer stack for the rest of the material. The process 30 includes forming a substrate of alternating layers 402 and 404 of polysilicon and silicon nitride to form a stack of alternating conductor layers 402 and insulator layers 404, and forming a channel region 406 in the substrate (see FIG. 4A). For example, forming the substrate may include depositing alternating layers 404 and 402 of silicon nitride and polysilicon and etching a pillar to form a NPNP layer stack 400. In embodiments, forming the NPNP layer stack 400 may typically include low pressure chemical vapor deposition (LPCVD) deposited substitutionally doped polysilicon and silicon nitride.

Figure 4A:
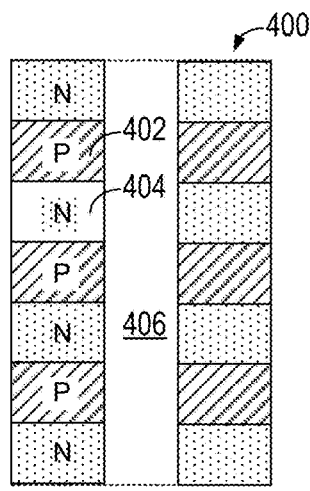
FIGS. 4A to 4F are illustrative diagrams of an example of a wordline airgap (WLAG) integration process according to an embodiment.
Figure 4B:
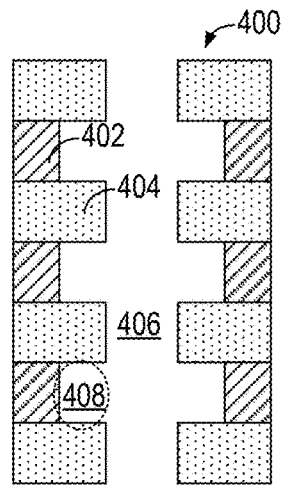
Figure 4C:
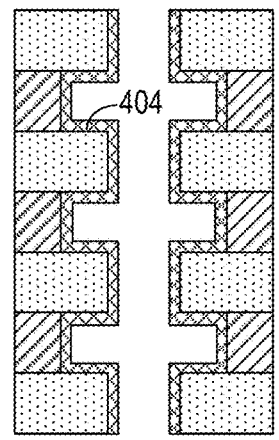
Figure 4D:
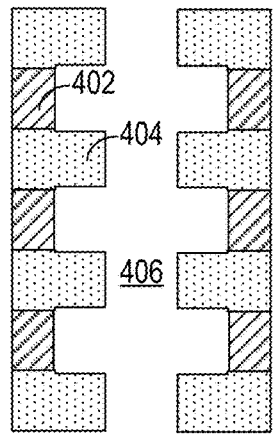

After the layer stack formation, an anisotropic etch into the layer stack 400 of polysilicon/nitride layers may form a channel region 406 in the substrate at block 22 (e.g., see process 30 at FIG. 4A). Forming the channel region 406 may include etching a cylinder-shaped hole 420 (FIGS. 4G and 4H) through the NPNP layer stack 400. After channel formation, a plurality of control gates adjacent to the channel region are formed at block 23 (e.g., see process 30 at FIG. 4B) via an isotropic etch of polysilicon layers 402 creates recessed cavity regions 408 in WLs selective to silicon nitride layers 404 adjacent to the plurality of control gates, a corresponding plurality of floating gates 47 at block 29 (e.g., see process 30 at FIG. 4F).

Figure 4E:
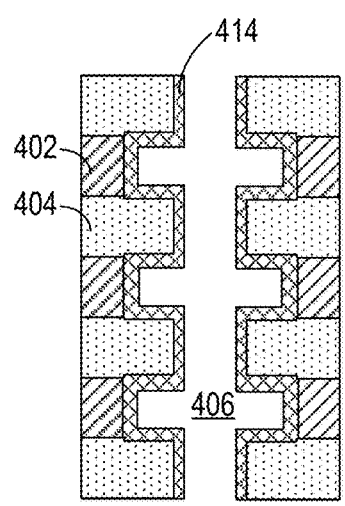

Before the formation of floating gates 47, corresponding etch-stop layers (ESLs) 414 comprises silicon dioxide (SiO$_2$) (e.g., oxide layers 43, 45, and 48) are created via growth and/or deposition that extend from the plurality of control gates 47 surrounding plurality of floating gate memory cells and respective layers of silicon nitride insulators (e.g., nitride layers 44 and 46) positioned between the plurality of control gates/wordlines at block 24 (e.g., see process 30 at FIG. 4E). The etch-stop layer 414 protects the memory cells during the etchant removal of silicon nitride layers via a chemical wet etch selective to the ESL oxide. Thus the airgap formation does not disrupt/degrade the memory cell with the incorporation of ESL 414.

The ESL 414 (FIG. 4F) in the illustrated embodiment is designed in such a way that it protects the memory cells during airgap formation as well as to not impact the cell size and/or areal density of the memory array. Depositing an ESL 414 in the control gate pockets created as mentioned above, would shrink the overall cell size and result in degradation of the NAND cell transistor performance. Therefore, an ESL 414 is formed with the proposed nitride/poly/nitride/poly (NPNP) layer stack via a 2-step growth-etch process from the plurality of alternating silicon nitride layers. The method 20 may include growing a sacrificial layer of oxide over the cavity regions from silicon nitride tiers positioned between the plurality of polysilicon wordlines at block 25, and then isotropic etching of the sacrificial layer selective to polysilicon control gates 47 and silicon nitride tiers to expand a size of the plurality of cavity regions for accommodating the subsequent ESL 414 at block 26. For example, a first step of the process 30 includes growing silicon oxide out of nitride layers for a thickness matching half of that of desired ESL thickness (e.g., see process 30 at FIG. 4D). After this oxide is formed, it is etched away selectively to polysilicon and nitride layers (e.g., see process 30 at FIG. 4D). This allows for increasing the cavity length to accommodate for ESL thickness so the final cavity length is matched to a QLC memory cell even after the ESL 414 is formed. Advantageously, embodiments of the ESL formation process provide results that match that of a conventional state-of-the-art FG NAND cell. The method 20 may then include forming the actual etch stop layers, which may comprise growing or depositing a silicon oxide layer on the expanded plurality of cavity regions at block 27. The second step includes growing the silicon dioxide which is the actual ESL 414 (e.g., see process 30 at FIG. 4E). This oxide-based ESL 414 not only serves as an etch-stop during the airgap formation, but also is a part of the floating gate cell.

The method 20 then includes forming, adjacent to the plurality of control gates, after ESL formation, a corresponding plurality of floating gates at block 28. Some embodiments of the method 20 may include forming the plurality of floating gates by depositing or growing films of silicon oxide, silicon nitride, polysilicon in the plurality of cavity regions and a shared polysilicon channel inside the channel region connecting all the control gates within a vertical NAND string at block 29. For example, after ESL formation, the rest of the floating cell formation continues with the formation of a polysilicon floating gate, a tunnel oxide grown out of floating gate polysilicon, and deposition of a polysilicon channel inside the hole (e.g., see process 30 at FIG. 4F) to provide a QLC floating gate NAND cell that may be fabricated similarly and may be of comparable performance as a conventional QLC NAND cell. For example, the process 30 may include growing or depositing a middle dielectric layer of a multi-layer dielectric (inter-gate dielectric or IGD) over a surface of each of the plurality of cavity regions. In embodiments, depositing the second IGD layer may include growing or depositing a silicon nitride layer/silicon oxide/silicon nitride layer stack (e.g., see FIG. 4F). Next, the process 30 may include to selectively oxidize or etch portions of the silicon nitride layer or second IGD layer to form a tapered edge. In embodiments, formation of a tapered feature of a modified floating gate and dielectric layer geometry may begin at this stage. The process 30 may then include removing portions of the second IGD layer that cover insulator layers between one or more of control gate regions. For example, the process 30 may further include growing an additional layer of the multi-layer dielectric to substantially insulate the second IGD layer. Next, the process 30 may include depositing an additional layer (e.g., a barrier layer) over the multi-layer dielectric and over both alternating layers of the NPNP layer stack. For example, the barrier layer may comprise an atomic layer deposition (ALD) of silicon nitride.

Figure 4F:
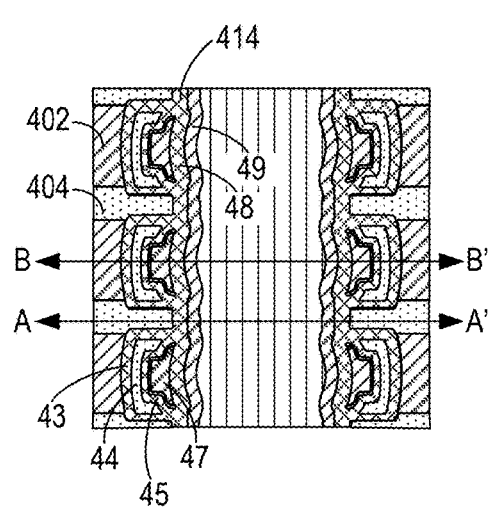
Figure 4G:
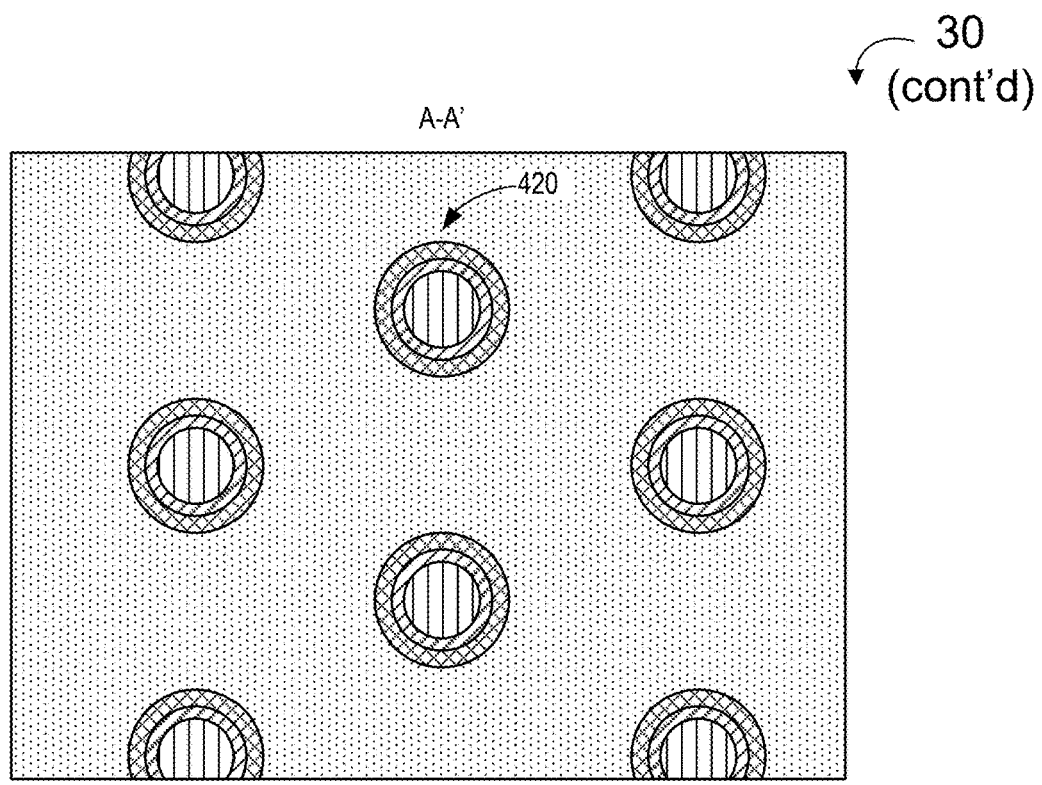
FIGS. 4G and 4H are illustrative top cross-sectional views of floating gate (FG) NAND memory cells according to an embodiment.
Figure 4H:
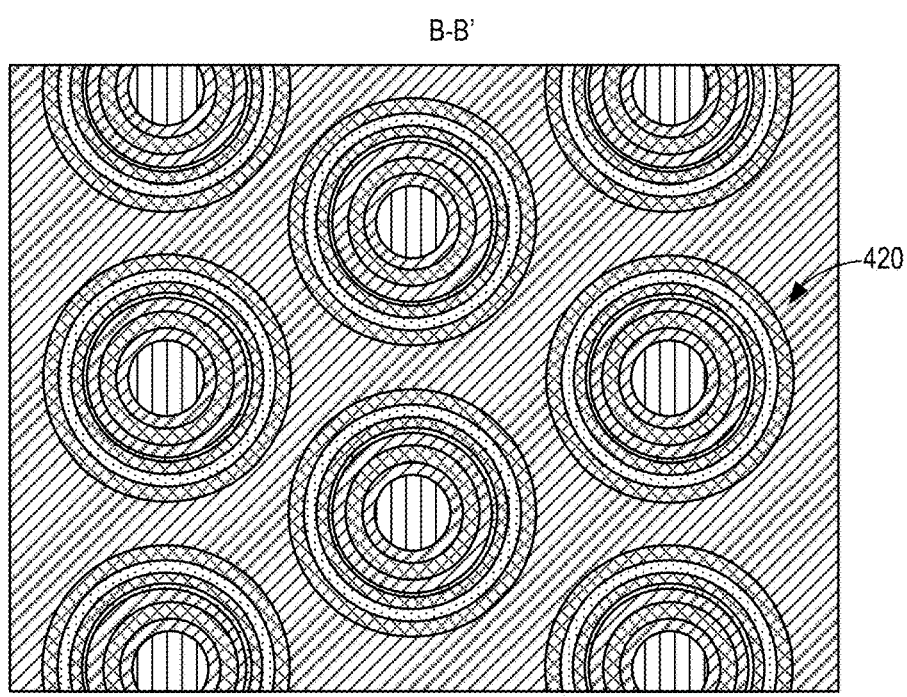

Next, the process 30 may include forming, adjacent to the plurality of control gates, a corresponding plurality of floating gates, each of the floating gates to extend as long as a corresponding control gate. In some embodiments, the process 30 may include depositing a polysilicon material that may become one or more floating gates. Next, a partial etch back of polysilicon material may form discrete floating gates. In embodiments, some of all of the barrier layer (e.g., silicon nitride) between one or more floating gates may be removed to achieve a silicon nitride isolation between adjacent memory cells. Next, a tunnel dielectric layer (e.g., see tunnel dielectric layer) may be formed. Tunnel dielectric may be made from silicon oxide (SiO), silicon oxy-nitride (SiON) films. In embodiments, a silicon oxide may be grown on polysilicon material of floating gates. In some embodiments, this stage may substantially complete isolation of the barrier layer (e.g., silicon nitride layer) between adjacent memory cells. Next, in embodiments, a channel semiconductor film may be deposited. In embodiments, a dielectric fill may then complete formation of the floating gate NAND memory cells (the forming of the plurality of control gates is also complete). FIGS. 4G and 4H illustrate the top-view of multiple FG NAND strings, out of which one of the strings is represented in cross-sectional form in FIGS. 4A to 4F to show the individual FG NAND cells wrapped around the string. When dissected across the middle of a layer of dielectric material (e.g., a sacrificial nitride layer where plane A-A' is located in FIG. 4F), the tunnel dielectric, ESL_ and polysilicon channel are shown (see FIG. 4G). When dissected across the middle of a polysilicon WL (e.g., plane B-B' in FIG. 4F), all the layers of a FG NAND cell are shown (e.g., see FIG. 4H).

The entire string of vertical 3D NAND memory cells share a common polysilicon channel completing the memory cells formation. This gives rise to a plurality of wordlines respectively coupled to the plurality of control gates as shown in FIG. 4F, and the read/write/erase functionality of these 3D NAND memory cells happen via charge trapping/detrapping/sensing between the polysilicon channel and floating gates respectively.

FIGS. 5A to 5B show a representative floating gate NAND cell 40 before (FIG. 5A) and after (FIG. 5B) the sacrificial layers of silicon nitride are removed. The cross-sections shown in FIGS. 5A-B are illustrative of one-side of the gate-all round FG NAND cells (e.g., a left side of the channel region) shown in FIG. 4F. The embodiment shown in prior sections of formation of floating gate NAND cells enabling inter-WL airgap on NPNP layer stack does not impact the foot-print of the cells with the addition of ESL due to the method described in the embodiment in an NPNP layer stack. As shown in FIGS. 5A-B, an embodiment of the floating gate NAND memory cell 40 may include a polysilicon WL 41, silicon nitride as sacrificial dielectric layers 42, and thermal oxide (layers 43, 45, and 48) silicon nitride (layers 44 and 46), and polysilicon (layers 47 and 49) arranged as illustrated as part of the cell stack. In general, the manufacture and construction of the memory cell 40 may be similar to a modified floating gate NAND memory cell but with a NPNP layer stack instead of alternating layers of oxide and polysilicon (e.g., an OPOP stack) and with an outermost layer 43 of thermal oxide extending from the control gate to the floating gate to provide an ESL for a silicon nitride layer 44 of the memory cell 40. For example, the layers 43, 44, 45, and 46 may be IGD layers, the layer 47 may be a polysilicon floating gate, the layer 48 may be a tunnel oxide, and the layer 49 may be a polysilicon channel The silicon nitride material 42 (see FIG. 5A) in between the polysilicon material 41 (that corresponds to the WLs) is removed to provide a WL airgap (WLAG, see FIG. 5B).

Figure 6:
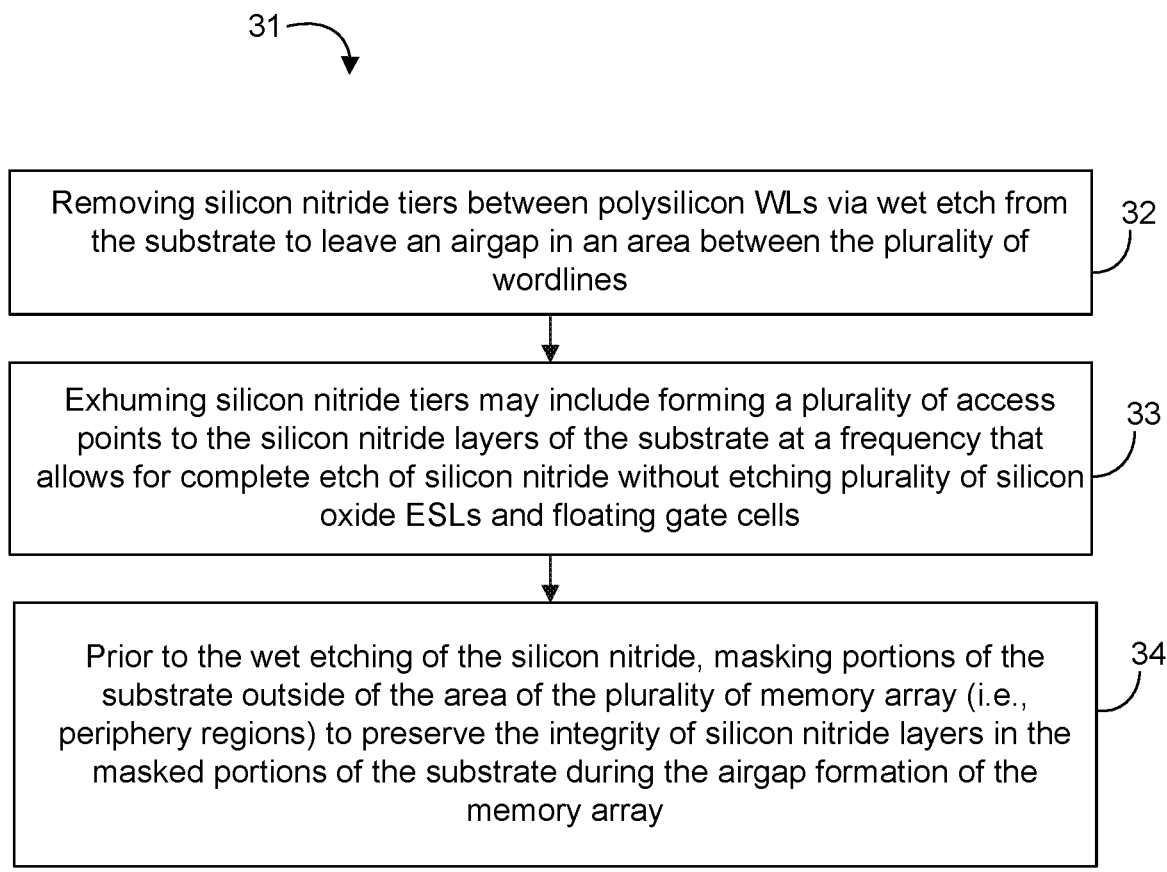
FIG. 6 is a flowchart of an example of a method according to an embodiment.

With reference to FIG. 6, an embodiment of a method 31 illustrates the process of airgap formation by removing silicon nitride layers from the layer stack to leave an airgap in an area between the plurality of wordlines. Some embodiments of the method 31 may include removing silicon nitride tiers between polysilicon WLs via wet etch from the substrate to leave an airgap in an area between the plurality of wordlines at block 32. In some embodiments of the method 31, exhuming silicon nitride tiers may include forming a plurality of access points to the silicon nitride layers of the substrate at a frequency that allows for complete etch of silicon nitride without etching plurality of silicon oxide ESLs and floating gate cells at block 33. In some embodiments, prior to the wet etching of the silicon nitride, the method 31 may include masking portions of the substrate outside of the area of the plurality of memory array (i.e., periphery regions) to preserve the integrity of silicon nitride layers in the masked portions of the substrate during the airgap formation of the memory array at block 34.

For example, the method 31 may also include forming a plurality of access points to the silicon nitride layers of the substrate. For example, removing the silicon nitride may comprise wet etching the silicon nitride via the access points. Some embodiments of the method 31 may include, prior to the wet etching of the silicon nitride, masking portions of the substrate outside of the area of the plurality of floating gates to preserve the silicon nitride layers in the masked portions of the substrate.

As compared to a conventional FG NAND cell, embodiments of a NPNP stack based FG cell with WLAG integration may exhibit a small increase in area overhead for incorporating WLAG replacement features or access points. However, incorporating inter-WL airgap enables relaxed WL driver requirements (e.g., due to a 4X RC drop, CMOS circuit drivers that power the plurality of NAND arrays), and better 3D NAND cell scaling capability (e.g., Z-direction scaling of cell size which lead to increased density of memory transistors/mm2 with enhanced performance). The NPNP FG NAND cell architecture with WLAG manufacturing process may involve creating the plurality of modified FG NAND cells as described above on an NPNP stack, and an isotropic etch process to remove the sacrificial inter-WL dielectric layers (i.e., silicon nitride) to achieve the airgaps between WLs.

To avoid non-array (i.e., periphery region contacts) disruption, (e.g., for circuits outside the array area), some embodiments constrain the airgaps (e.g., the removal of the silicon nitride material) to the array area (i.e., active region where 3D NAND FG cells are formed). Some embodiments provide access areas to exhume the silicon nitride via etching isotropically from all directions. After airgap formation, these access points may be pinched off so that the subsequent steps in the processing of dies are not impacted. A voided dielectric deposition fill may be utilized to preserve the void between the wordlines and seal the access areas to maintain voids between the wordlines. This is followed by planarization of the surface sealing the access areas for subsequent processing steps.

Embodiments may be manufactured from an OPOP stack with a suitable ESL during the layer oxide exhume, with some compromises in cell capability and/or an increased cell size. Advantageously, embodiments manufactured from a NPNP stack may eliminate the need for an extra ESL (e.g., the outermost thermal oxide layer provides the ESL). NPNP provides flexibility of an oxidation grown from layer polysilicon and layer silicon nitride, which protects the cell stack from etchant during the layer nitride exhume (e.g., and results in a substantially matched cell size with the conventional OPOP FG NAND cell).

Figure 7:
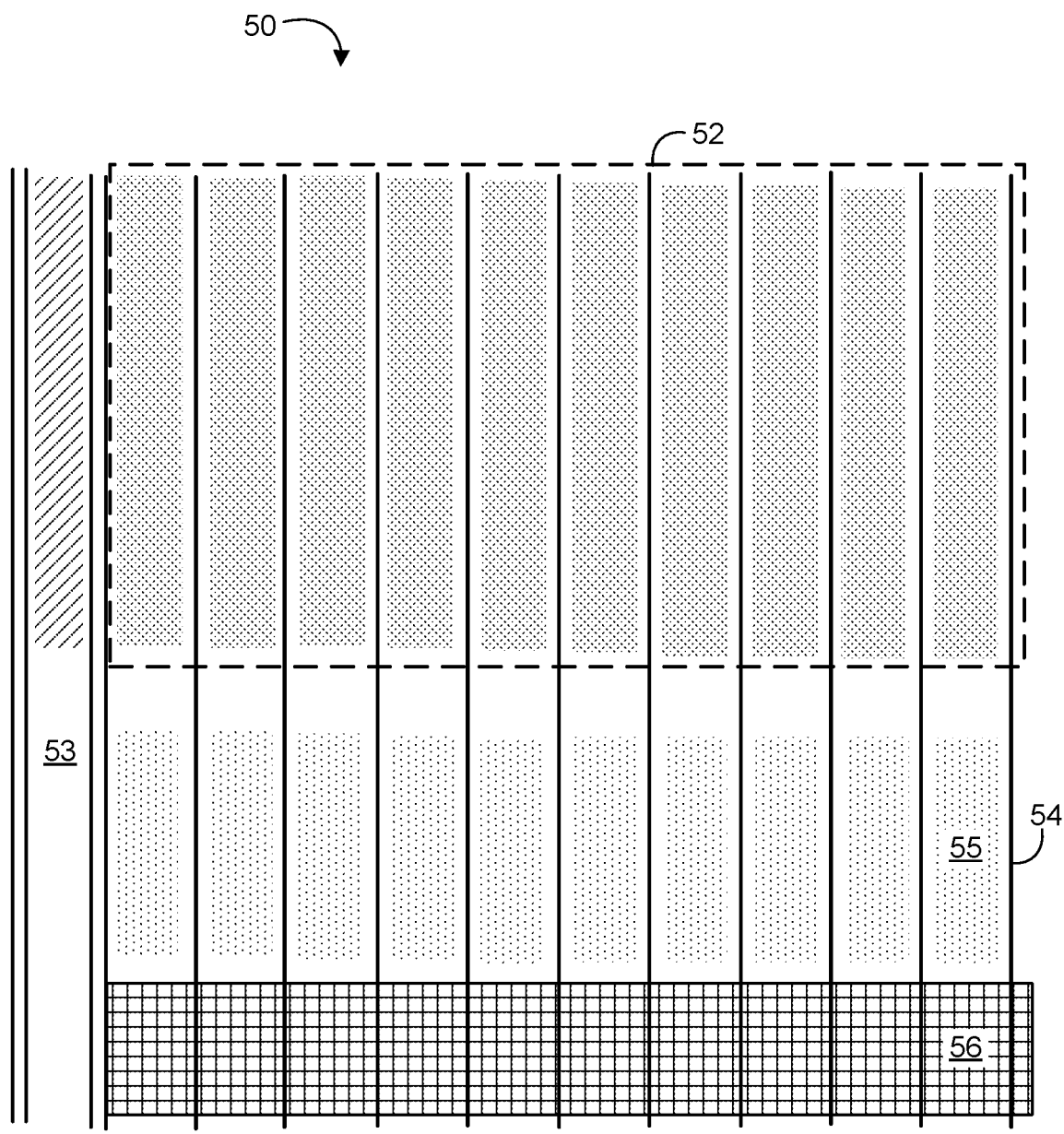
FIGS. 7 to 10 are illustrative, partial top views of the layout of an example of a three-dimensional (3D) FG NAND array/periphery regions according to an embodiment.

FIG. 7, shows top-down view of layout of an embodiment of an example of a 3D memory array die 50 which includes an array 52 of 3D NAND strings (i.e., several thousands of 3D strings shown in FIGS. 4G-H) together with additional circuitry outside of an area of the array 52. For example, circuitry including connections to the circuit under array 53, 54 may be provided outside of the array 52, and WL contacts 55 may be provided outside the array 52. Selective masking technique may be utilized to provide minimal or no disruption/impact to non-array/periphery regions 53, 54, 55, 56 of the 3D memory die layout 50. For example, some embodiments may utilize spin-on-carbon type of coating (e.g., a high-volume manufacturable coating) to mask the periphery regions during the silicon nitride layers exhume to form the inter-wordline airgap (WLAG), to contrain the WLAG formation to only the area of the array 52.

Figure 8:
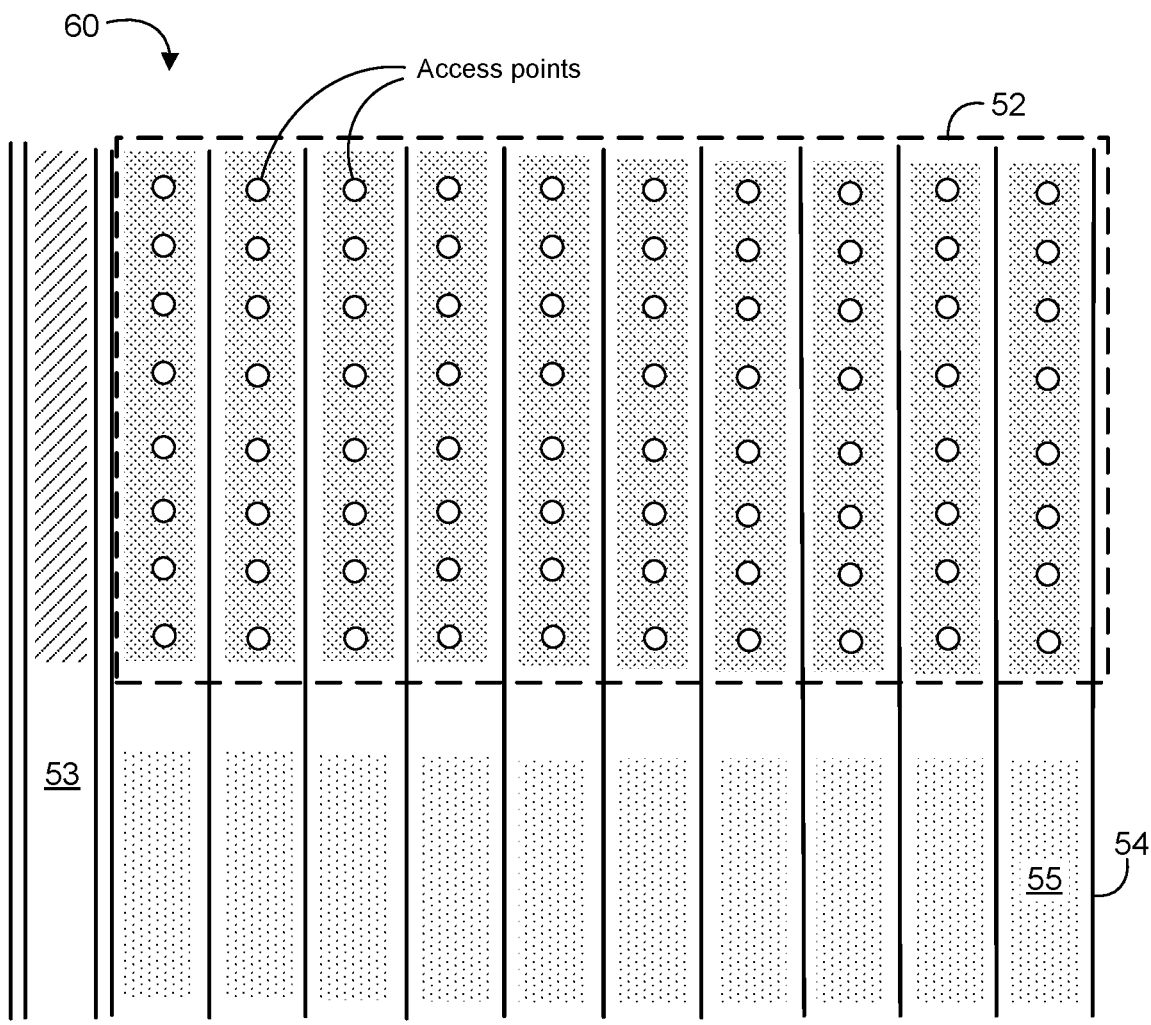
Figure 9:
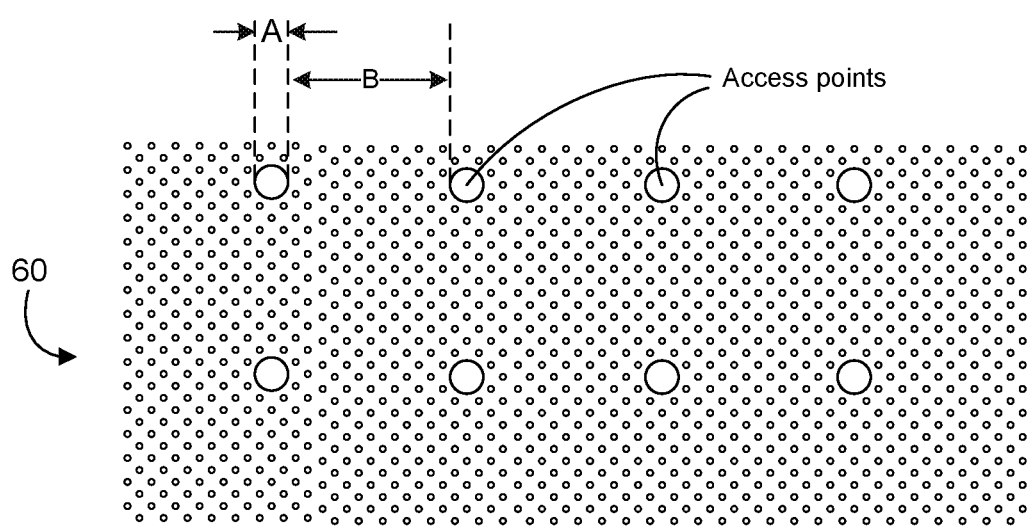
Figure 10:
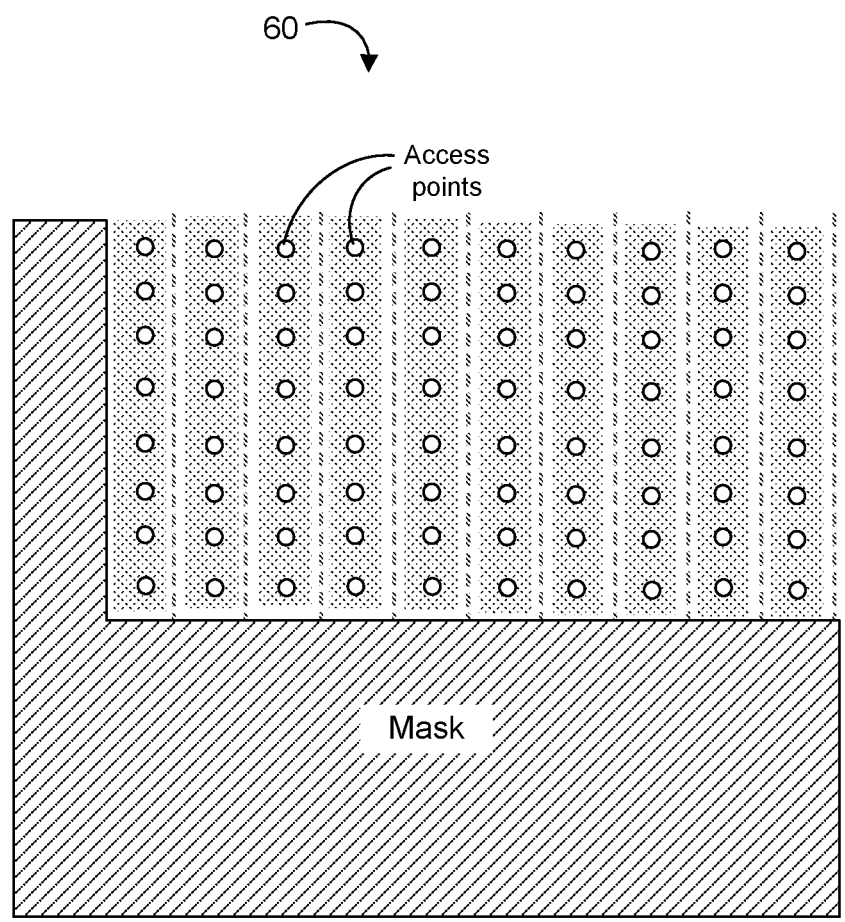

FIGS. 8 to 10 illustrate an embodiment of a process 60, that may be utilized together with the process 30, to keep the layer nitride exhume away from the periphery region of a 3D memory die (e.g., the non-array/periphery regions 53, 54, 55, and 56 in FIG. 7). The process 60 may include any type of process which embodies etching the replacement features/access points to nitride layers across the height of the NPNP layer stack along with the periphery contact vias at the same time/step. This enables the access points formation without adding additional process cost to manufacture. The access points are designed in a way to maximize the nitride exhume without eroding the ESL protecting the plurality of FG NAND cells, as well as minimize the area overhead penalty that results with additional access points in the array regions (see FIG. 9). The dimensions of access points (A) may be determined by the process capability of etching these features anisotropically through the entire height of the NPNP layer stack. The frequency of these access points (B) may be determined by the selectivity of etch chemistry of nitride layers to the ESL protecting the FG NAND cells in the array. The process 60 may then include masking the non-array/periphery regions with a type of spin-on carbon coating that will be resistive to the chemistry used for nitride layers exhume (see FIG.10). Spin-on-carbon coating is used in state-of-the-art semiconductor manufacturing processes for a variety of applications, some of which include using as a sacrificial gap-fill in deep trenches, using as a type of hardmask for etching critical features, etc. After masking the periphery regions, the access points are exposed to the etching solution in the array region for exhuming layer nitride layers.

Figure 11:
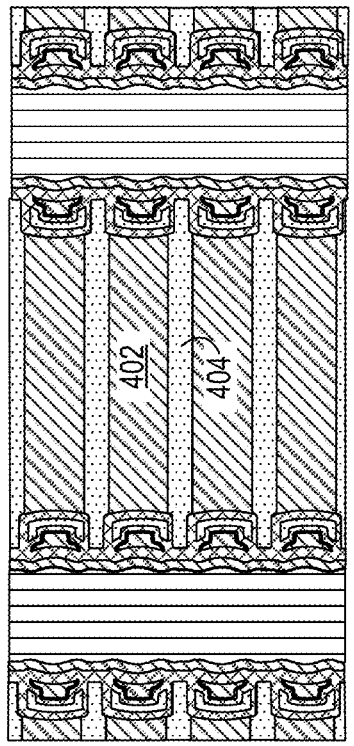
FIGS. 11 and 12 are side cross sectional views of a 3D FG NAND memory array illustrating WLAG formation.
Figure 11:
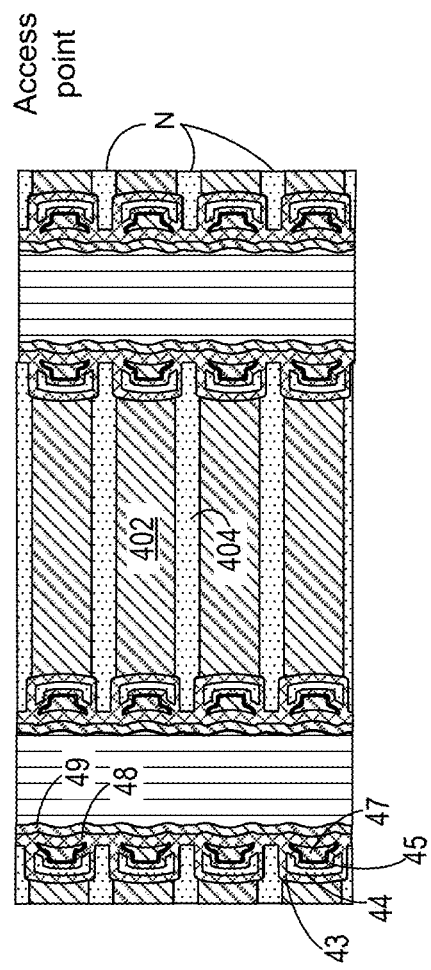
Figure 12:
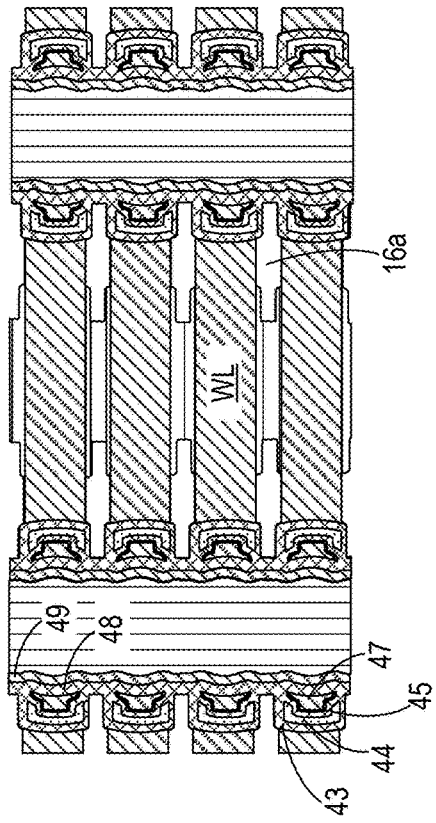
Figure 14A:
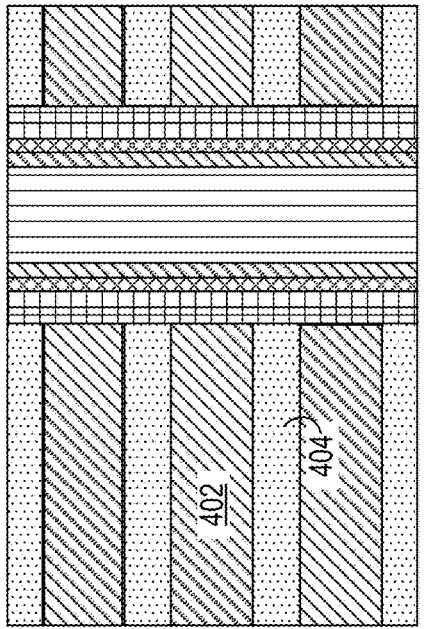
FIGS. 14A to 14D are illustrative diagrams of another example of a wordline airgap (WLAG) integration process according to an embodiment.
Figure 14A:
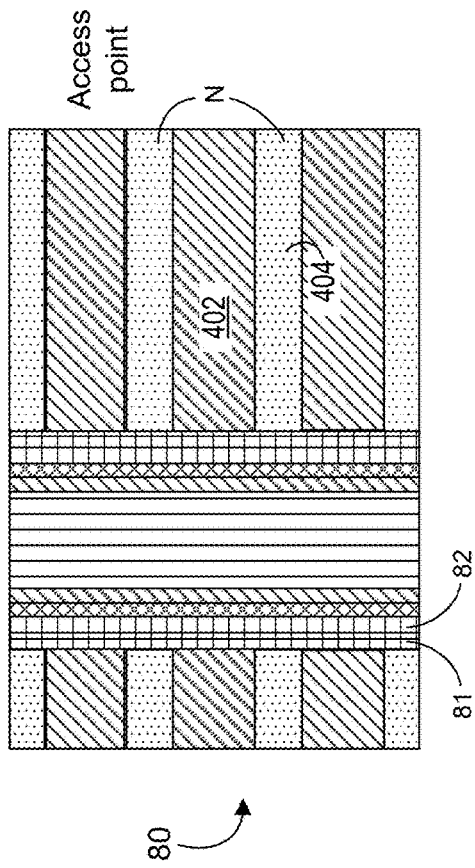
Figure 14B:
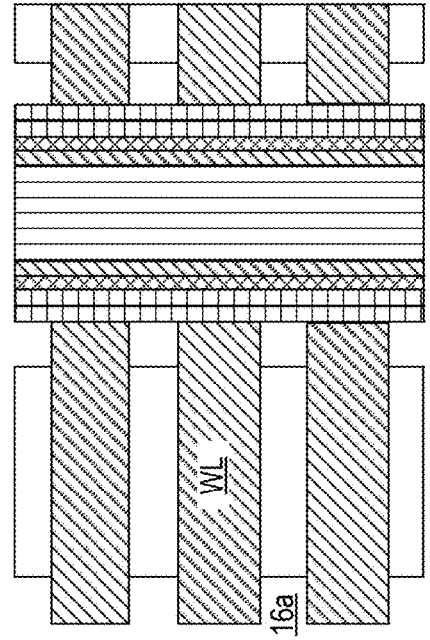
Figure 14B:
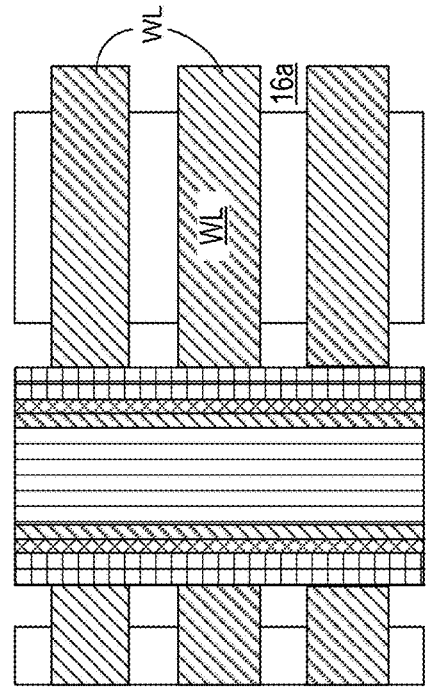
Figure 14C:
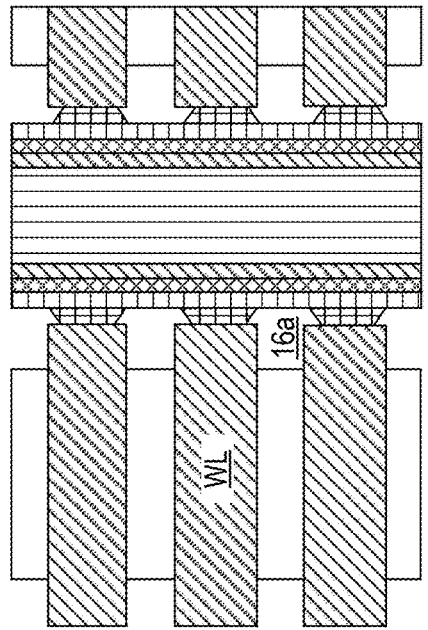
Figure 14C:
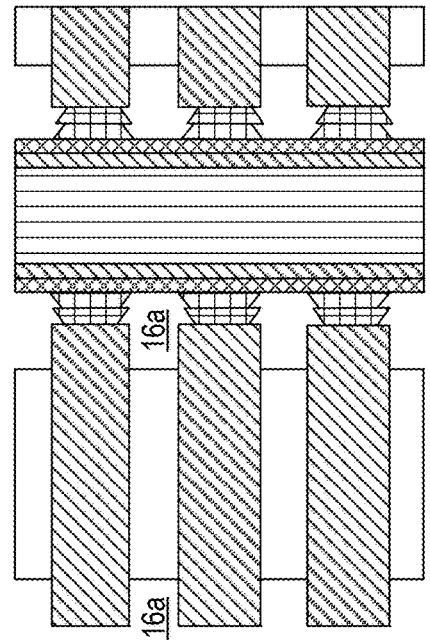
Figure 14D:
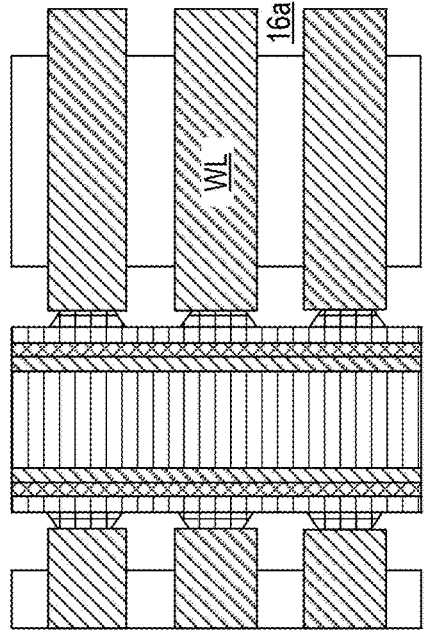
Figure 14D:
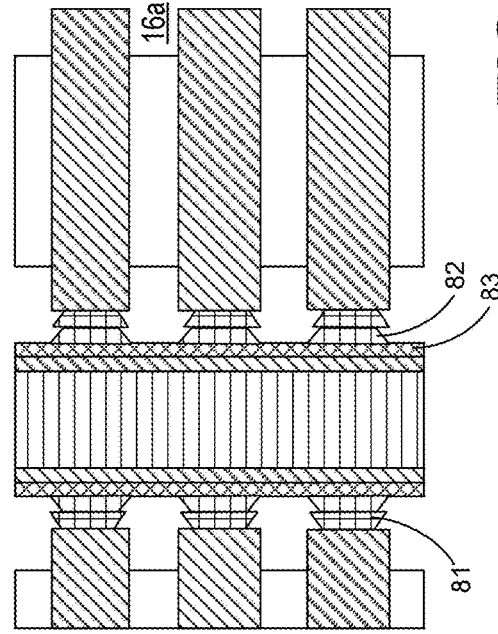

After masking the periphery regions and exposing the access points in array regions, silicon nitride layers are then exhumed laterally from these access points with a wet etch chemistry of phosphoric acid ($H_3PO_4$) which may exhibit up to ~500:1 etch selectivity to silicon dioxide ESL. In particular, for every 500nm exhume of silicon nitride layers, there may be ~1nm of ESL etch. FIGS. 11 and 12 illustrate an example of 3D NAND FG cells before and after silicon nitride layers (N) are exhumed. ESL protects the memory cells while the sacrificial nitride layers are exhumed away with a selective wet etching chemistry described above. After the nitride layers exhume, the WLAG is formed only in the array while the non-array regions are not disturbed (e.g., they are protected with carbon) and have nitride layers between the polysilicon layers.

Any known process may be utilized to seal/pinch-off the access points. Post-WLAG formation, for example, the access points created in the array may be pinched-off by sealing them with a partial gap-fill-like process (e.g., a non-conformal dielectric fill such that the top of the access points are sealed without completely filling the access points or jeopardizing the airgap) and planarization of surface such that the subsequent processes are unaffected. Such gap-fill processes may include low-k dielectric materials like silicon dioxide ($SiO_2$) which are extensively used in state-of-the-art semiconductor high-volume manufacturing. The partial gap-fill-like processes may be developed to achieve the access points pinch-off at the top, while having minimal amount of filling inside the features.

Advantageously, embodiments of a polysilicon-based 3D NAND layer exhibit stack structural stability after WLAG formation. With 3D NAND memory technology scaling to increase the density (GB/mm2), one of the areas of scaling is to increase the layer stack height with every tech node, incorporating more layers of WLs accompanied by layer dielectrics between the WLs. Embodiments of WLAG formation do not disrupt/compromise the layer stack structural stability or integrity. Accordingly, WLAG can be integrated into a 3D NAND layer stack without compromising/collapsing the array stability.

With reference to FIGS. 13A-C, embodiments of 3D NAND strings 70a, 70b, and 70c each include WL airgap technology as described herein. FIG. 13A illustrates a 3D NAND string of WLAG FG NAND memory cells 70a (e.g., a 3D NAND string of the memory cells 30 from FIG. 4F), FIG. 13B illustrates a 3D NAND string of CTF NAND memory cells 70b which incorporate WLAG as described herein. CTF NAND memory cells are another type of NAND memory cell architecture along with FG NAND memory cell architecture described herein. CTF memory cells with WLAG 70b, 70c illustrated in FIGS. 13B-C consist of P-type doped polysilicon as a control gate, silicon dioxide as a blocking dielectric which serve a similar purpose as the IGD films in a typical FG NAND memory cell (e.g., as shown in FIG. 5B). The storage node, however, in a CTF NAND cell is formed by a silicon nitride di-electric film where the charges are trapped/detrapped/sensed during program/erase/read operations respectively. P-type doped polysilicon WLs are sandwiched between silicon nitride dielectric layers of the layer stack as described for FG NAND cell architecture to be able to form WLAG. Embodiments for the CTF NAND cells 70b, 70c described herein differs from architecture of conventional CTF memory cells employed in replacement-gate NAND memory architecture.

Replacement-gate (e.g., a term used for replacing layer film with a conductive metal as a control gate) NAND memory products/architectures employ CTF NAND memory cells, where the layer stack is composed of alternating layers of silicon oxide and silicon nitride layers (e.g., an ONON layer stack). The nitride layers are sacrificial and are exhumed with a similar technique described in this embodiment to be replaced later with conductive metal film via deposition from the access points. After the layer stack is anisotropically etched in the channel regions to the substrate, the blocking oxide and charge-trap nitride layers are deposited inside the channel region, followed by deposition of tunnel oxide and polysilicon vertical channel But a conventional ONON layer stack-based CTF NAND cell architecture cannot accommodate WLAG in a practical implementation because of limitations of the processing. In particular, the ONON layer stack would require 1) an ESL, that might disrupt the cell capabilities; 2) high selectivity between the layer oxide and a high-K barrier film; and/or 3) an expensive double replacement process. Some embodiments may provide manufacturing technology to provide a WL airgap for CTF NAND cells 70b, 70 c as illustrated in FIGS. 13B and 13C.

For the CTF memory cells 70b and 70c, a NPNP layer stack is utilized instead of the conventional ONON layer stack, which supports the silicon nitride exhume process and films selectivity similar to FG NAND cell WLAG integration as described herein. A p-type polysilicon WL replaces the metal/high-k barrier control gate in the conventional CTF cell, which performs a similar role in program/erase of the cell. The NPNP stack and p-type polysilicon WL allows for a single replacement without an additional ESL. Embodiments of the WLAG technology in CTF NAND cells advantageously may allow more aggressive vertical scaling for CTF NAND cells as compared to FG NAND cells due to both the presence of airgap void between adjacent wordlines as well as the isolation of the storage nodes.

One of the key differences between FG NAND cell and CTF NAND cell is the storage node architecture. In FG NAND cell, the storage node is made of poly-silicon which is isolated for every control gate. Hence, the storage node may be referred to as floating gate NAND. On the other hand, the CTF cell storage node is made of silicon nitride and is shared among all the control gates within a 3D NAND string. Due to this reason, the reliability of CTF NAND cells is inferior compared to FG NAND cell as the charges that are trapped in this continuous storage node film have high possibility of re-distributing among adjacent/neighboring control gates. This is referred to as charge retention and is one of the critical reliability metrics when describing the performance of a NAND cell. Therefore, CTF NAND cells suffer from poor charge retention capability compared to FG NAND cells. One of the methods to improve the data retention reliability in CTF cell architecture is to isolate the charge-trap nitride (or storage node) for every control gate similar to FG NAND cell architecture. WLAG in some embodiment of a CTF memory architecture not only provides performance boost, but also allows for isolating CTF nitride film (ISO_CTF) via the same access points used for WLAG formation. This enables for enhanced charge retention capability for CTF NAND cells. See FIG. 13C, which illustrates a 3D NAND string of WLAG ISO_CTF memory cells 70c. Therefore, WLAG formation along with isolated storage node CTF architecture may result in significant performance improvement for a CTF NAND memory architecture.

FIG. 14A to 14D illustrate an embodiment of a process 80 of manufacturing an isolated storage node CTF cell having an inter-wordline airgap. After the CTF NAND cell formation as described earlier, the access points are formed by etching through the NPNP layer stack similar to FG NAND cell architecture described in earlier sections (see FIG. 14A). The design of these access features are also similar to FG-based NPNP stack because the layer to be exhumed is silicon nitride selective to polysilicon and silicon oxide layers. After access points formation, the nitride layers are exhumed leaving behind the airgap between polysilicon WLs (see FIG. 14B). To obtain ISO-CTF cell structure, the block oxide 81 and CT nitride film stack 82 need to be isolated for every WL. This may be achieved by selective etching of these layers via the access features. First, the block oxide 81 is etched with a dilute hydro-flouric acid (HF) chemistry (e.g., 1:100 HF: $H_2O$) selective to the CT nitride 82 and polysilicon WLs (see FIG. 14C). Due to the isotropic nature of the etch chemistry, after the block oxide etch, the isolated oxide layers may exhibit the trapezoid shape. Next, the CT nitride film 82 is etched with a phosphoric acid ($H_3PO_4$) wet chemistry selective to block oxide 81 and tunnel oxide 83 as well as polysilicon WLs (see FIG. 14D). This etch may also lead to trapezoid profile for the CT nitride layer 82 (see FIGS. 13C and 14D)

Accordingly, embodiments of WLAG may be successfully implemented in both FG and CTF NAND memory cell architectures as described herein. As a result, a significant performance boost and scaling efficiency may be achieved in both architectures.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 15:
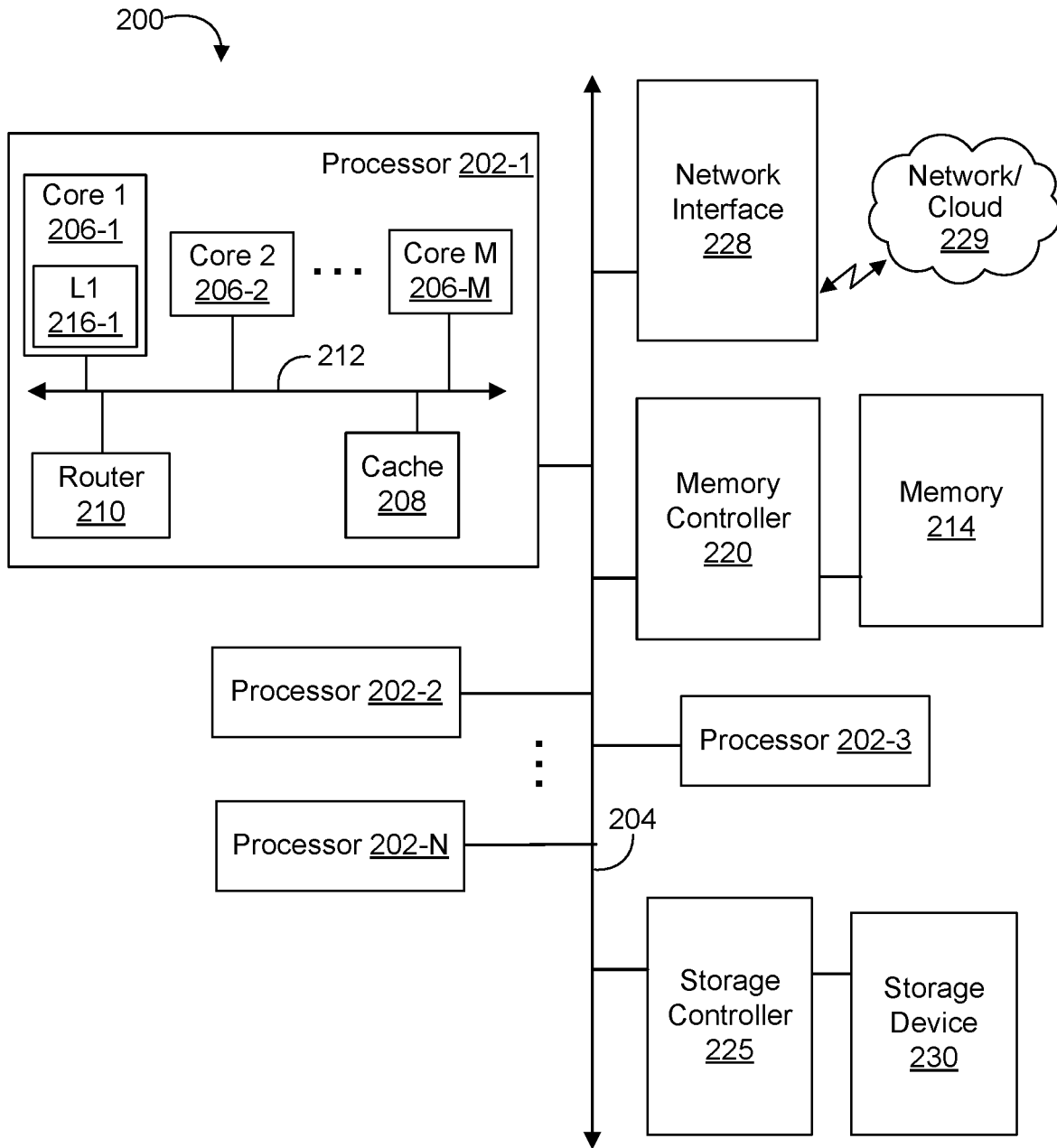
FIG. 15 is a block diagram of an example of a computing system according to an embodiment.

Turning now to FIG. 15, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 15, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 15, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 229.

System 200 may also include a storage device such as a storage device 230 coupled to the interconnect 204 via storage controller 225. Hence, storage controller 225 may control access by various components of system 200 to the storage device 230. Furthermore, even though storage controller 225 is shown to be directly coupled to the interconnection 204 in FIG. 10, storage controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, storage controller 225 may be incorporated into memory controller logic or provided on a same integrated circuit (IC) device in various embodiments (e.g., on the same circuit board device as the storage device 230 or in the same enclosure as the storage device 230).

Furthermore, storage controller 225 and/or storage device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, storage device 230, SSD bus, SATA bus, storage controller 225, etc., to sense variations in various factors affecting power/thermal behavior of the system/platform, such as temperature, operating frequency, operating voltage, power consumption, and/or inter-core communication activity, etc.

Any of the memory and/or storage devices in the system 200 may include the 3D NAND memory with WLAG described herein.

Additional Notes and Examples

Example 1 includes a memory device, comprising a vertical channel a first memory cell formed on the vertical channel a first wordline coupled to the first memory cell a second memory cell formed on the vertical channel immediately above the first memory cell a second wordline coupled to the second memory cell, and an airgap disposed between the first wordline and the second wordline.

Example 2 includes the memory device of Example 1, further comprising a vertical three-dimensional (3D) NAND string of memory cells formed along the vertical channel respective wordlines coupled to each memory cell of the 3D NAND string, and respective airgaps disposed between each of the respective wordlines.

Example 3 includes the memory device of Example 2, further comprising an array of vertical 3D NAND strings of memory cells, and additional circuitry outside the array, wherein the respective airgaps are formed only in the area of the array.

Example 4 includes the memory device of Example 3, further comprising a plurality of access points to the respective airgaps in the area of the array.

Example 5 includes the memory device of any of Examples 2 to 4, wherein the memory cells comprise floating gate NAND memory cells.

Example 6 includes the memory device of Example 5, wherein a layer stack for the vertical 3D NAND string of memory cells comprises alternating layers of silicon nitride and polysilicon.

Example 7 includes the memory device of Example 6, further comprising respective control gates positioned between respective floating gate NAND memory cells and respective wordlines respective layers of silicon nitride positioned between the respective control gates and the respective floating gate NAND memory cells, and respective thermal oxide layers that completely surround the respective silicon nitride layers positioned between the respective control gates and the respective floating gate NAND memory cells.

Example 8 includes the memory device of any of Examples 2 to 4, wherein the memory cells comprise charge trap flash NAND memory cells.

Example 9 includes a system, comprising a processor, and a three-dimensional (3D) memory device coupled with the processor, wherein the 3D memory device includes a vertical channel a first memory cell formed on the vertical channel a first wordline coupled to the first memory cell a second memory cell formed on the vertical channel immediately above the first memory cell a second wordline coupled to the second memory cell, and an airgap disposed between the first wordline and the second wordline.

Example 10 includes the system of Example 9, wherein the 3D memory device further comprises a vertical 3D NAND string of memory cells formed along the vertical channel respective wordlines coupled to each memory cell of the 3D NAND string, and respective airgaps disposed between each of the respective wordlines.

Example 11 includes the system of Example 10, wherein the 3D memory device further comprises an array of vertical 3D NAND strings of memory cells, and additional circuitry outside the array, wherein the respective airgaps are formed only in the area of the array.

Example 12 includes the system of Example 11, wherein the 3D memory device further comprises a plurality of access points to the respective airgaps in the area of the array.

Example 13 includes the system of any of Examples 10 to 12, wherein the memory cells comprise floating gate NAND memory cells.

Example 14 includes the memory device of Example 13, wherein a layer stack for the vertical 3D NAND string of memory cells comprises alternating layers of silicon nitride and polysilicon.

Example 15 includes the system of Example 14, further comprising respective control gates positioned between respective floating gate NAND memory cells and respective wordlines respective layers of silicon nitride positioned between the respective control gates and the respective floating gate NAND memory cells, and respective thermal oxide layers that completely surround the respective silicon nitride layers positioned between the respective control gates and the respective floating gate NAND memory cells.

Example 16 includes the system of any of Examples 10 to 12, wherein the memory cells comprise charge trap flash NAND memory cells.

Example 17 includes the system of any of Examples 9 to 16, wherein the system comprises a mobile computing device and further includes at least one of a display communicatively coupled to the processor or a battery coupled to the processor.

Example 18 includes a method to manufacture a memory device, comprising forming a substrate of alternating layers of polysilicon and silicon nitride to form a stack of alternating conductor and insulator layers forming a channel region in the substrate forming a plurality of control gates adjacent to the channel region forming, adjacent to the plurality of control gates, a corresponding plurality of floating gates forming respective etch stop layers extending from the plurality of control gates to the plurality of floating gates that surround respective layers of silicon nitride positioned between the plurality of control gates and the plurality of floating gates forming a plurality of wordlines respectively coupled to the plurality of control gates, and removing silicon nitride from the substrate to leave an airgap in an area between the plurality of wordlines.

Example 19 includes the method of Example 18, wherein forming the channel region in the substrate comprises anisotropic etching of a cylinder-shaped hole through the stack of alternating silicon nitride and polysilicon layers.

Example 20 includes the method of any of Examples 18 to 19, wherein forming the plurality of control gates adjacent to the channel region comprises isotropic etching of polysilicon layers in the stack of alternating polysilicon and silicon nitride layers to create a plurality of cavity regions growing or depositing a sacrificial layer of oxide over the cavity regions, and isotropic etching of the sacrificial layer to expand a size of the plurality of cavity regions.

Example 21 includes the method of any of Examples 18 to 20, wherein forming the respective etch stop layers comprises growing or depositing a silicon oxide layer on the expanded plurality of cavity regions.

Example 22 includes the method of any of Examples 18 to 21, further comprising forming a plurality of access points to the silicon nitride layers of the substrate.

Example 23 includes the method of Example 22, wherein removing the silicon nitride comprises wet etching the silicon nitride via the access points.

Example 24 includes the method of Example 23, further comprising prior to the wet etching of the silicon nitride, masking portions of the substrate outside of the area of the plurality of floating gates to preserve the silicon nitride layers in the masked portions of the substrate.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A memory device, comprising:
   a vertical channel;
   a first memory cell formed on the vertical channel;
   a first wordline coupled to the first memory cell;
   a second memory cell formed on the vertical channel immediately above the first memory cell;
   a second wordline coupled to the second memory cell; and
   an airgap disposed between the first wordline and the second wordline, wherein a bottom surface of the second wordline and a top surface of the first wordline are planar, face one another, and extend while remaining in parallel to each other.

2. The memory device of claim 1, further comprising:
   a vertical three-dimensional (3D) NAND string of memory cells formed along the vertical channel;
   respective wordlines coupled to each memory cell of the 3D NAND string; and
   respective airgaps disposed between each of the respective wordlines.

3. The memory device of claim 2, further comprising:
   an array of vertical 3D NAND strings of memory cells; and
   additional circuitry outside the array, wherein the respective airgaps are only within the array.

4. The memory device of claim 3, further comprising:
   a plurality of access points to the respective airgaps within the array.

5. The memory device of claim 2, wherein the memory cells comprise floating gate NAND memory cells.

6. The memory device of claim 5, wherein a layer stack for the vertical 3D NAND string of memory cells comprises alternating layers of silicon nitride and polysilicon.

7. The memory device of claim 6, further comprising:
   respective control gates positioned between respective floating gate NAND memory cells and respective wordlines;
   respective layers of silicon nitride positioned between the respective control gates and the respective floating gate NAND memory cells; and
   respective thermal oxide layers that completely surround the respective silicon nitride layers positioned between the respective control gates and the respective floating gate NAND memory cells.

8. The memory device of claim 2, wherein the memory cells comprise one of charge trap flash (CTF) NAND memory cells and isolated CTF NAND memory cells.

9. A system, comprising:
   a processor; and
   a three-dimensional (3D) memory device coupled with the processor, wherein the 3D memory device includes:
   a vertical channel,
   a first memory cell formed on the vertical channel,
   a first wordline coupled to the first memory cell,
   a second memory cell formed on the vertical channel immediately above the first memory cell,
   a second wordline coupled to the second memory cell, and
   an airgap disposed between the first wordline and the second wordline;
   wherein a bottom surface of the second wordline and a top surface of the first wordline are planar, face one another, and extend while remaining in parallel to each other.

10. The system of claim 9, wherein the 3D memory device further comprises:
    a vertical 3D NAND string of memory cells formed along the vertical channel;
    respective wordlines coupled to each memory cell of the 3D NAND string; and
    respective airgaps disposed between each of the respective wordlines.

11. The system of claim 10, wherein the 3D memory device further comprises:
    an array of vertical 3D NAND strings of memory cells;
    a plurality of access points to the respective airgaps within the array; and
    additional circuitry outside the array, wherein the respective airgaps are formed only within the array.

12. The system of claim 10, wherein the vertical channel includes a first vertical channel, and the 3D memory device further comprises:
    a second vertical channel adjacent to the first vertical channel;
    a third memory cell formed on the second vertical channel; and
    a fourth memory cell formed on the second vertical channel immediately above the third memory cell:
    wherein two distinct ends of the first wordline are coupled to the first memory cell and the third memory cell, and two distinct ends of the second wordline are coupled to the second memory cell and the fourth memory cell.

13. The system of claim 10, wherein the memory cells comprise one of floating gate NAND memory cells and charge trap flash NAND memory cells.

14. The system of claim 13, wherein the memory cells comprise floating gate NAND memory cells and wherein a layer stack for the vertical 3D NAND string of memory cells comprises alternating layers of silicon nitride and polysilicon, further comprising:
- respective control gates positioned between respective floating gate NAND memory cells and respective wordlines;
- respective layers of silicon nitride positioned between the respective control gates and the respective floating gate NAND memory cells; and
- respective thermal oxide layers that completely surround the respective silicon nitride layers positioned between the respective control gates and the respective floating gate NAND memory cells.

* * * * *